(12) United States Patent
Lee

(10) Patent No.: US 12,424,291 B2
(45) Date of Patent: Sep. 23, 2025

(54) MEMORY DEVICE AND MEMORY SYSTEM FOR USING READ COMPENSATION SCHEME AND OPERATING METHOD OF THE SAME

(71) Applicant: SK hynix Inc., Gyeonggi-do (KR)

(72) Inventor: Seon Ju Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 257 days.

(21) Appl. No.: 18/188,475

(22) Filed: Mar. 23, 2023

(65) Prior Publication Data

US 2024/0127897 A1    Apr. 18, 2024

(30) Foreign Application Priority Data

Oct. 17, 2022   (KR) ........................ 10-2022-0133078

(51) Int. Cl.
| | |
|---|---|
| *G11C 16/34* | (2006.01) |
| *G11C 16/04* | (2006.01) |
| *G11C 16/10* | (2006.01) |
| *G11C 16/20* | (2006.01) |

(52) U.S. Cl.
CPC ...... *G11C 16/3459* (2013.01); *G11C 16/0433* (2013.01); *G11C 16/102* (2013.01); *G11C 16/20* (2013.01)

(58) Field of Classification Search
CPC ............ G11C 16/3459; G11C 16/0433; G11C 16/102; G11C 16/20; G11C 16/08; G11C 16/3431; G11C 16/26; G11C 16/10; G11C 16/3404

See application file for complete search history.

(56) References Cited

U.S. PATENT DOCUMENTS

| | | | |
|---|---|---|---|
| 10,559,366 | B2 | 2/2020 | Shen et al. |
| 10,902,925 | B1 | 1/2021 | Lien et al. |
| 2021/0264986 | A1* | 8/2021 | Kim ...................... G11C 29/021 |
| 2022/0301645 | A1* | 9/2022 | Banerjee ................ G11C 16/08 |
| 2023/0012855 | A1* | 1/2023 | Sheperek ............. G11C 29/021 |
| 2024/0096423 | A1* | 3/2024 | Yu .......................... G11C 16/08 |

* cited by examiner

*Primary Examiner* — Jerome Leboeuf
(74) *Attorney, Agent, or Firm* — IP & T GROUP LLP

(57) ABSTRACT

A memory device includes: a plurality of memory blocks each including a plurality of word lines, a control operation circuit configured to perform a read operation on each of the plurality of word lines, and a control logic configured to: store a plurality of default levels, which respectively correspond to the memory blocks, in an information storage region therein, control the control operation circuit to perform one of a first read operation using a selected default level corresponding to a selected block and a second read operation using an adjusted level smaller than the selected default level, reset the adjusted level to the selected default level when a number of times that the second read operation is passed is greater than a number of times that the first read operation is passed, by a reference number of times or more, and store the reset level in the information storage region.

21 Claims, 7 Drawing Sheets

FIG. 3A 161 or 163

|  | DEFAULT LEVEL | PASS VALUE<1> | PASS VALUE<2> |
|---|---|---|---|
| MEMORY BLOCK<1> (CLOSE) | DFV1 | N/A | N/A |
| MEMORY BLOCK<2> (OPEN) | DFV2 | 0 | 0 |
| MEMORY BLOCK<3> (OPEN) | DFV3 | 2 | 2 |
| MEMORY BLOCK<4> (OPEN) | DFV4 | 8 | 3 |
| MEMORY BLOCK<6> (OPEN) | DFV5 | 1 | 2 |
| MEMORY BLOCK<7> (ERASE) | DFV6 | N/A | N/A |

FIG. 3B 161 or 163

AFTER STATE OF FIG. 3A

1. PERFORM READ OPERATION ON BOUNDARY WL OF THIRD BLOCK, DFV3-A IS PASSED AFTER DFV3 FAILS.
2. PERFORM READ OPERATION ON BOUNDARY WL OF FIFTH BLOCK, DFV5-A IS PASSED AFTER DFV5 FAILS.

*WL: Word Line

|  | DEFAULT LEVEL | PASS VALUE<1> | PASS VALUE<2> |
|---|---|---|---|
| MEMORY BLOCK<1> (CLOSE) | DFV1 | N/A | N/A |
| MEMORY BLOCK<2> (OPEN) | DFV2 | 0 | 0 |
| MEMORY BLOCK<3> (OPEN) | DFV3 | 2 | 2 → 3 |
| MEMORY BLOCK<4> (OPEN) | DFV4 | 8 | 3 |
| MEMORY BLOCK<5> (OPEN) | DFV5 | 1 | 2 → 3 |
| MEMORY BLOCK<6> (ERASE) | DFV6 | N/A | N/A |

FIG. 3C 161 or 163

> IN STATE OF FIG. 3B
>
> 1. SINCE SECOND PASS VALUE OF 3 OF FIFTH BLOCK IS GREATER THAN FIRST PASS VALUE OF 1 BY REFERENCE VALUE OF 2 OR MORE, DEFAULT LEVEL CORRESPONDING TO FIFTH BLOCK IS CHANGED TO DFV5-A.
> 2. SINCE DEFAULT LEVEL CORRESPONDING TO FIFGH BLOCK IS CHANGED, FIRST AND SECOND PASS VALUES ARE INITIALIZED.

|  | DEFAULT LEVEL | PASS VALUE<1> | PASS VALUE<2> |
|---|---|---|---|
| MEMORY BLOCK<1> (CLOSE) | DFV1 | N/A | N/A |
| MEMORY BLOCK<2> (OPEN) | DFV2 | 0 | 0 |
| MEMORY BLOCK<3> (OPEN) | DFV3 | 2 | 3 |
| MEMORY BLOCK<4> (OPEN) | DFV4 | 8 | 3 |
| MEMORY BLOCK<5> (OPEN) | DFV5 → DFV5-A | 1 → 0 | 3 → 0 |
| MEMORY BLOCK<6> (ERASE) | DFV6 | N/A | N/A |

REFERENCE VALUE: 2

FIG. 3D 161 or 163

AFTER STATE OF FIG. 3C

1. BOUNDARY WL IS CHANGED ACCORDING TO PROGRAM
OPERATION ON THIRD BLOCK
→ FIRST AND SECOND PASS VALUES ARE INITIALIZED
2. PERFORM READ OPERATION ON BOUNDARY WL OF FOURTH
BLOCK, DFV4-A ALSO FAILS AFTER DFV4 FAILS
→ PERFORM READ OPERATION USING MULTIPLE READ
RETRY LEVELS (DIFFERENT FROM DFV4)

*WL: Word Line

| | DEFAULT LEVEL | PASS VALUE<1> | PASS VALUE<2> |
|---|---|---|---|
| MEMORY BLOCK<1> (CLOSE) | DFV1 | N/A | N/A |
| MEMORY BLOCK<2> (OPEN) | DFV2 | 0 | 0 |
| MEMORY BLOCK<3> (OPEN) | DFV3 | 2 → 0 | 3 → 0 |
| MEMORY BLOCK<4> (OPEN) | DFV4 | 8 | 3 |
| MEMORY BLOCK<5> (OPEN) | DFV5-A | 0 | 0 |
| MEMORY BLOCK<6> (ERASE) | DFV6 | N/A | N/A |

REFERENCE VALUE:2

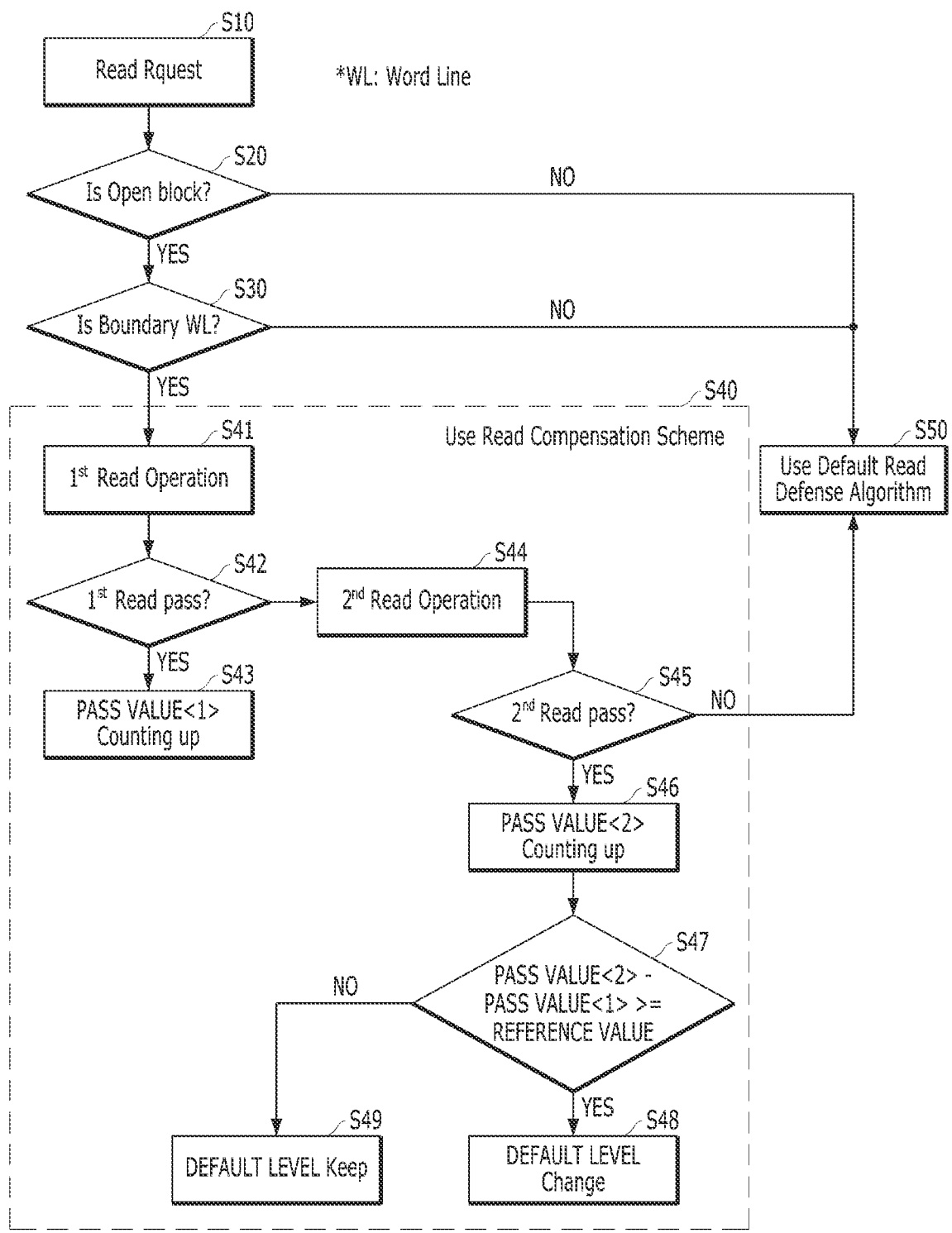

MEMORY DEVICE AND MEMORY SYSTEM FOR USING READ COMPENSATION SCHEME AND OPERATING METHOD OF THE SAME

CROSS-REFERENCE TO RELATED APPLICATION(S)

The present application claims priority under 35 U.S.C. § 119(a) to Korean Patent Application No. 10-2022-0133078, filed on Oct. 17, 2022, the disclosure of which is incorporated herein by reference in its entirety.

BACKGROUND

1. Field

Various embodiments of the present disclosure relate to a semiconductor integrated circuit, and more particularly, to a memory device and a memory system for using a read compensation scheme, and an operating method of the memory system.

2. Description of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted.

Memory cells of a non-volatile memory device such as a flash memory device may store data by being programmed to have threshold voltage distributions representing different logic states. A predetermined read voltage may be applied to the memory cells each having a predetermined threshold voltage, and the data stored in the memory cells may be read.

The threshold voltage distributions may vary depending on physical locations of the programmed memory cells or states of other memory cells adjacent to the programmed memory cells. When data are read by applying a predetermined read voltage to all memory cells having different threshold voltage distributions, data may be normally read from some memory cells, but read failure in which data are incorrectly read from some other memory cells may occur. Formerly, when the read failure occurs, data have been read by a different method according to a read sequence that is defined in advance.

SUMMARY

Various embodiments of the present disclosure are directed to a memory device and a memory system capable of dynamically changing a read level used in a read compensation scheme for a boundary word line programmed last in a memory block, and an operating method of the memory system.

These technical problems to be achieved from the present disclosure are not limited to those described above, and other technical problems not described will be apparently understood by those skilled in the art, to which the present disclosure pertains, from the following description.

According to an aspect of an embodiment of the present disclosure, a memory system may include: a memory device including a plurality of memory blocks each including a plurality of word lines; and a controller configured to: store a plurality of default levels, which respectively correspond to the plurality of memory blocks, in an information storage region therein, and perform a read operation on a selected word line of a selected block among the plurality of memory blocks, wherein the read operation is performed by: performing a read operation using a selected default level of the plurality of default levels, the selected default level corresponding to the selected block, and performing, when the read operation using the selected default level fails, a read operation using an adjusted level smaller than the selected default level by a predetermined level, and wherein the controller is further configured to: reset the adjusted level to the selected default level when a number of times that the read operation using the adjusted level is passed is greater than a number of times that the read operation using the selected default level is passed by a reference number of times or more, and store the reset level in the information storage region.

According to an aspect of an embodiment of the present disclosure, a memory device may include: a plurality of memory blocks each including a plurality of word lines; a control operation circuit configured to perform a read operation on each of the plurality of word lines and outputting whether the read operation performed is passed or failed; and a control logic configured to: store a plurality of default levels, which respectively correspond to the plurality of memory blocks, in an information storage region therein, control the control operation circuit to perform one of a first read operation using a selected default level corresponding to a selected block among the plurality of default levels and a second read operation using an adjusted level smaller than the selected default level by a predetermined level, reset the adjusted level to the selected default level when a number of times that the second read operation is passed is greater than a number of times that the first read operation is passed, by a reference number of times or more, and store the reset level in the information storage region.

According to an aspect of an embodiment of the present disclosure, an operating method of a memory device, the operating method may include: setting a boundary word line corresponding to a word line programmed last in an open block among a plurality of memory blocks to a selected word line and performing a read operation on the selected word line; performing a first read operation on the selected word line using a selected default level of a plurality of default levels; performing, when the first read operation fails, a second read operation on the selected word line using an adjusted level smaller than the selected default level by a predetermined level; counting, as a first pass value, a number of times that the first read operation is passed and counting, as a second pass value, a number of times that the second read operation is passed; and resetting the adjusted level to the selected default level when the second pass value is greater than the first pass value by a reference value or more.

According to an aspect of an embodiment of the present disclosure, an operating method of a control unit, the operating method may include: counting first and second numbers of successes of respective first and second read operations on a memory cell group, the first and second read operations being performed according to respective first and second read biases and the second read operation being performed when the first read operation fails; and replacing, when the second number becomes greater than the first number by a threshold, a value of the first read bias with a value of the second read bias for subsequent read operations.

BRIEF DESCRIPTION OF THE DRAWINGS

FIGS. 3A to 3D are diagrams illustrating an example of a read compensation scheme in accordance with an embodiment of the present disclosure.

FIG. 4 is a flowchart for describing an operation sequence of a read compensation scheme in accordance with an embodiment of the present disclosure.

DETAILED DESCRIPTION

Figure 1:
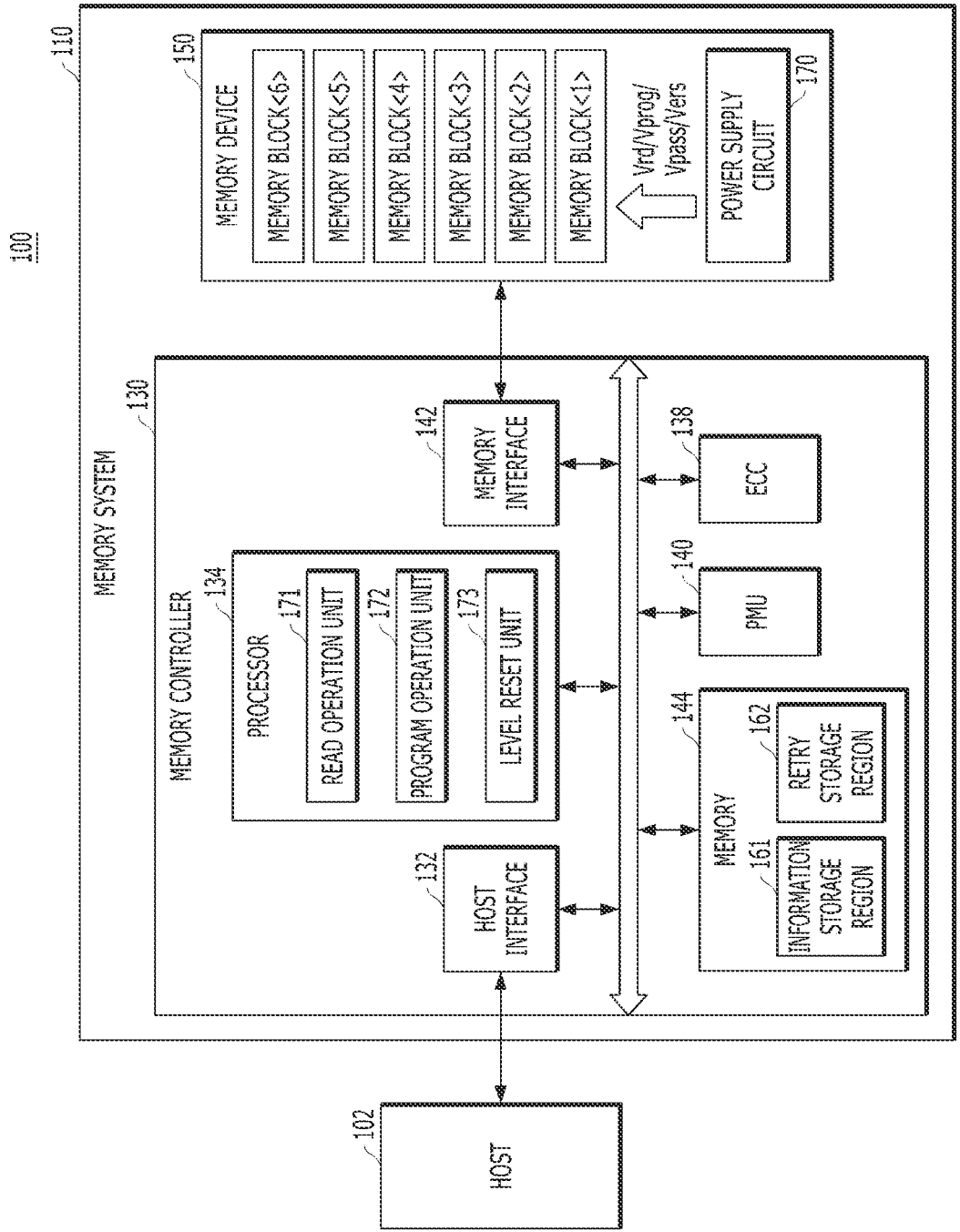
FIG. 1 is a block diagram illustrating an example of a data processing system including a memory system in accordance with an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a block diagram illustrating an example of a data processing system 100 including a memory system 110 in accordance with an embodiment of the present disclosure.

Referring to FIG. 1, the data processing system 100 may include a host 102 engaged or coupled with the memory system 110. For example, the host 102 and the memory system 110 can be coupled to each other via a data bus, a host cable and the like to perform data communication.

The memory system 110 may include a memory device 150 and a memory controller 130. The memory device 150 and the memory controller 130 in the memory system 110 may be considered components or elements physically separated from each other. The memory device 150 and the memory controller 130 may be connected via at least one data path. For example, the data path may include a channel and/or a way.

According to an embodiment, the memory device 150 and the memory controller 130 may be components or elements functionally divided. Further, according to an embodiment, the memory device 150 and the memory controller 130 may be implemented with a single chip or a plurality of chips. The memory controller 130 may perform a data input/output operation in response to a request input from the external device. For example, when the memory controller 130 performs a read operation in response to a read request input from an external device, data stored in a plurality of non-volatile memory cells included in the memory device 150 is transferred to the memory controller 130.

The memory controller 130 may control the memory device 150 to perform read, program and erase operations corresponding to commands inputted from the host 102, and the memory system 110 may independently perform the operations regardless of commands inputted from an external device such as the host 102. With respect to the memory device 150, the memory controller 130 may also perform a garbage collection (GC) operation, a wear leveling (WL) operation and a bad block management operation of checking and processing bad blocks.

The memory device 150 may include a plurality of memory blocks MEMORY BLOCK<1:6>. The memory blocks MEMORY BLOCK<1:6> may be understood to be a group of non-volatile memory cells from which data are removed together through the erase operation. Each of the memory blocks MEMORY BLOCK<1:6> may include a page (not illustrated) in which the non-volatile memory cells are grouped, from a logical point of view, such as storing data together during the program operation or outputting data together during the read operation. For example, one memory block may include a plurality of pages. One page may include a plurality of non-volatile memory cells.

From a physical point of view different from the logical point of view such as the program operation or the read operation, one memory block may include a plurality of word lines (not illustrated). One word line may include a plurality of non-volatile memory cells.

In this case, one word line may correspond to at least one page according to the number of bits that can be stored or expressed in one non-volatile memory cell. For example, when one non-volatile memory cell is a single level cell (SLC) storing one data bit, one word line may correspond to one page. When one non-volatile memory cell is a double level cell (DLC) storing two data bits, one word line may correspond to two pages. When one non-volatile memory cell is a triple level cell (TLC) storing three data bits, one word line may correspond to three pages. When one non-volatile memory cell is a quadruple level cell (QLC) storing four data bits, one word line may correspond to four pages. In this way, when one non-volatile memory cell is a multiple level cell storing five or more data bits, one word line may correspond to five or more pages.

According to an embodiment, the memory controller 130 may use an MLC memory block included in the memory device 150 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the memory controller 130 may perform a data input/output operation with a higher speed when the MLC memory block is used as the SLC memory block. Thus, the memory controller 130 may use the MLC memory block as a SLC buffer or a write booster to temporarily store data because the buffer may require a high data input/output speed for improving performance of the memory system 110.

Further, according to an embodiment, the memory controller 130 can program data in an MLC a plurality of times without performing an erase operation on a specific MLC memory block included in the memory device 150. In general, non-volatile memory cells do not support data overwrite. However, the memory controller 130 may program 1-bit data in the MLC a plurality of times using a feature in which the MLC is capable of storing multi-bit data. For an MLC overwrite operation, the memory controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored 1-bit data.

In an embodiment, the memory device 150 is embodied as a non-volatile memory such as a flash memory, for example, a NAND flash memory, a NOR flash memory, or the like. In another embodiment, the memory device 150 may be implemented by at least one of a phase change random access memory (PCRAM), a ferroelectrics random access memory (FRAM), a transfer torque random access memory (SU-RAM), and a spin transfer torque magnetic random access memory (STT-M RAM), or the like.

The memory device 150 may include a voltage supply circuit 170 capable of supplying at least one voltage to the memory blocks MEMORY BLOCK<1:6>. The voltage supply circuit 170 may supply a read voltage Vrd, a program voltage Vprog, a pass voltage Vpass or an erase voltage Vers to the non-volatile memory cells included in each of the memory blocks MEMORY BLOCK<1:6>.

Examples of the data processing system 100 including the host 102 interworking with the memory system 110 or the memory system 110 may include a mobility electronic device such as an automotive, a portable electronic device such as a mobile phone, an MP3 player and a laptop computer and a non-portable electronic device such as a desktop computer, a game machine, a TV and a projector. The host 102 may provide interaction between the host 102 and a user using the data processing system 100 or the memory system 110 through at least one operating system (OS). The host 102 may transmit a plurality of commands corresponding to requests of the user to the memory system 110, and the memory system 110 may perform operations corresponding to the plurality of commands, i.e., operations corresponding to the requests of the user.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The memory controller 130 according to an embodiment may store a plurality of default levels, which respectively correspond to the memory blocks MEMORY BLOCK<1:6> included in the memory device 150, in an information storage region 161 therein. In this case, the plurality of default levels may refer to read levels used as a default when the read operation is performed on a selected word line of a selected block corresponding to a predetermined condition among the plurality of memory blocks MEMORY BLOCK<1:6> included in the memory device 150. In addition, the memory controller 130 may determine the plurality of default levels according to a physical location of each of the plurality of memory blocks MEMORY BLOCK<1:6> or various parameters such as a program/erase cycle.

In addition, when the number of times that the read operation using an adjusted level, which is smaller than a selected default level by a predetermined level, is passed is greater than the number of times that the read operation using the selected default level corresponding to the selected block among the plurality of default levels stored in the information storage region 161 is passed, by a reference number of times or more, the memory controller 130 may reset the adjusted level to the selected default level and store the reset level in the information storage region 162 when performing the read operation on the selected word line of the selected block corresponding to the predetermined condition. In this case, the memory controller 130 may perform the read operation using the selected default level on the selected word line of the selected block corresponding to the predetermined condition, and then perform the read operation using the adjusted level when the read operation using the selected default level fails.

More specifically, when performing the read operation on the selected word line of the selected block corresponding to the predetermined condition, the memory controller 130 may count, as a first pass value, the number of times that the read operation using the selected default level corresponding to the selected block among the plurality of default levels stored in the information storage region 161 is passed. When the read operation using the selected default level is performed on the selected word line of the selected block corresponding to the predetermined condition, and then the read operation using the selected default level fails, the memory controller 130 may count, as a second pass value, the number of times that the read operation using the adjusted level, which is smaller than the selected default level by the predetermined level, is passed. That is, when the read operation on the selected word line of the selected block corresponding to the predetermined condition is passed, the memory controller 130 may up-count the first pass value when the passed read operation is the read operation using the selected default level, and up-count the second pass value when the passed read operation is the read operation using the adjusted level. In this case, the memory controller 130 may store the first and second pass values in a form corresponding to the selected default level in the information storage region 161.

When the second pass value is greater than the first pass value by the reference number of times or more, the memory controller 130 may reset the adjusted level to the selected default level and store the reset level in the information storage region 161 when performing the read operation on the selected word line of the selected block corresponding to the predetermined condition. When resetting the adjusted level to the selected default level, the memory controller 130 may initialize the first and second pass values corresponding to the selected default level.

The memory controller 130 may set a boundary word line, which corresponds to a word line programmed last in an open block among the plurality of memory blocks MEMORY BLOCK<1:6> included in the memory device 150, as the selected word line of the selected block, and perform the read operation on the set word line. That is, the selected word line of the selected block corresponding to the predetermined condition may be the boundary word line corresponding to the word line programmed last in the open block among the plurality of memory blocks MEMORY BLOCK<1:6>.

The memory controller 130 may perform the program operation on the selected block, which is an open block, and when the boundary word line of the selected block is changed according to the program operation on the selected block, the memory controller 130 may reset the changed boundary word line to the selected word line. When resetting the selected word line of the selected block according to the program operation on the selected block, the memory controller 130 may initialize the first and second pass values corresponding to the selected default level.

For reference, the plurality of memory blocks MEMORY BLOCK<1:6> may be divided into open blocks, closed blocks and free blocks. In this case, the open blocks may be blocks in which data can be stored. The closed blocks may be blocks to which data have been written or data can no longer be written. The free blocks may be blocks to which data have not yet been written. Accordingly, a word line in which data has been already programmed and a word line in which data has not yet been programmed may be included together in the plurality of word lines included in the open blocks. The boundary word line may refer to a last programmed word line, and be in a state of being physically adjacent to the word line in which data have not yet been programmed. In this case, the state in which two word lines are physically adjacent to each other may refer to a state in which no physical word line is present between the two word lines.

The memory controller 130 may store a plurality of read retry levels in a retry storage region 162 therein. In this case, each of the plurality of read retry levels may refer to a level of a read voltage that the memory controller 130 uses when performing a read retry operation of retrying the read operation after the read operation on the memory device 150 fails.

The memory controller 130 may perform the read operation using the plurality of read retry levels when the read operation using the adjusted level, which is performed after the read operation using the selected default level fails on the selected word line of the selected block corresponding to the predetermined condition among the plurality of memory blocks MEMORY BLOCK<1:6>, fails.

The memory controller 130 may perform the read operation using the plurality of read retry levels without performing the read operation using the selected default level or the adjusted level when performing the read operation on the other word lines except for the boundary word line among the plurality of word lines included in the open block among the plurality of memory blocks MEMORY BLOCK<1:6>.

When performing the read operation on the plurality of word lines included in the closed block among the plurality of memory blocks MEMORY BLOCK<1:6> included in the memory device 150, the memory controller 130 may perform the read operation using the plurality of read retry levels without performing the read operation using the selected default level or the adjusted level.

The above-described operation of the memory controller 130 may be implemented through the operations of a read operation unit 171, a program operation unit 172 and a level reset unit 173 included in the memory controller 130. In this case, the read operation unit 171, the program operation unit 172 and the level reset unit 173 may be implemented as software, be loaded into the memory 144 in the memory controller 130, and then be executed by a processor 134. The read operation unit 171, the program operation unit 172 and the level reset unit 173 may be implemented as hardware.

Specifically, in response to a read request for the selected word line of the selected block corresponding to the predetermined condition, the read operation unit 171 may perform a first read operation using the selected default level corresponding to the selected block among the plurality of default levels stored in the information storage region 161, and perform a second read operation using the adjusted level smaller than the selected default level by a predetermined level when the first read operation fails.

The read operation unit 171 may perform the read operation, using the plurality of read retry levels stored in the retry storage region 162, on the selected word line when the second read operation also fails after the first read operation fails.

The read operation unit 171 may perform the read operation using the plurality of read retry levels stored in the retry storage region 162 without performing the first and second read operations in response to the read request for the other word lines except for the boundary word line among the plurality of word lines included in the closed block or the plurality of word lines included in the open block among the plurality of memory blocks MEMORY BLOCK<1:6>.

The level reset unit 173 may generate the first pass value obtained by counting a pass number of times through the first read operation and the second pass value obtained by counting a pass number of times through the second read operation, whenever the read operation performed by the read operation unit 171 on the selected word line is passed, and when the second pass value is greater than the first pass value by a reference value or more, the level reset unit 173 may reset the adjusted level to the selected default level, and store the reset level in the information storage region 161.

The level reset unit 173 may store the first and second pass values in a form corresponding to the selected default level in the information storage region 161.

When resetting the adjusted level to the selected default level, the level reset unit 173 may initialize the first and second pass values corresponding to the selected default level stored in the information storage region 161.

The program operation unit 172 may perform the program operation on at least one of the plurality of memory blocks MEMORY BLOCK<1:6> according to a program request. That is, the program operation unit 172 may perform the program operation on the selected block corresponding to the predetermined condition.

When the boundary word line of the selected block is changed according to the program operation performed on the selected block by the program operation unit 172, the changed boundary word line may be reset to the selected word line. In this way, when the boundary word line is changed according to the program operation performed on the selected block by the program operation unit 172 and the selected word line of the selected block is reset, the level reset unit 173 may initialize the first and second pass values corresponding to the selected default level stored in the information storage region 161.

Figure 2:
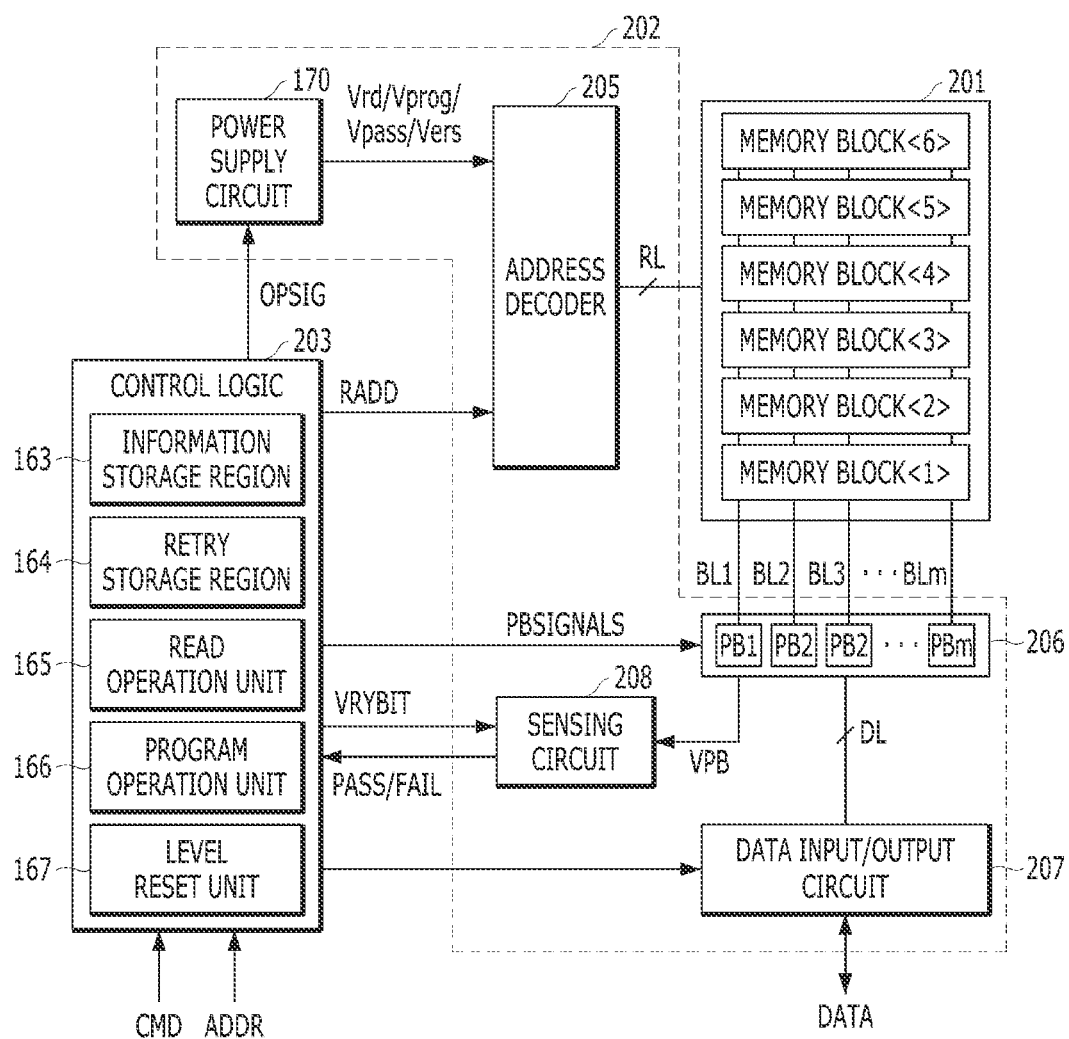
FIG. 2 is a block diagram illustrating an example of a memory device in accordance with an embodiment of the present disclosure.

According to an embodiment, the memory controller 130 may include a host interface 132, the processor 134, the error correction circuitry (ECC) 138, a power management unit (PMU) 140, a memory interface 142, and a memory 144. Components included in the memory controller 130 as illustrated in FIG. 2 may vary according to structures, functions, operation performance, or the like, regarding the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102. According to an embodiment, the host interface 132 is a type of layer for exchanging data with the host 102 and is implemented with, or driven by, firmware called a host interface layer (HIL).

The host interface 132 included in the memory controller 130 may receive signals, commands (or requests), and/or data input from the host 102 via a bus. For example, the host 102 and the memory system 110 may use a predetermined set of rules or procedures for data communication or a preset interface to transmit and receive data therebetween. Examples of sets of rules or procedures for data communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., x1, x4, x8, or x16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 110, such as an SSD, that is faster than a hard disk.

The error correction unit 138 may check and correct errors in data transmitted between the memory controller 130 and the memory device 150. The error correction unit 138 may be implemented as a separate module, circuit or firmware in the memory controller 130, but can also be implemented in the memory device 150 according to an embodiment.

The error correction circuitry 138 may include all circuits, modules, systems, and/or devices for performing the error correction operation based on at least one of the above-described codes.

The error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in the memory device 150. The ECC decoder can detect and correct error bits contained in the data read from the memory device 150 when the memory controller 130 reads the data stored in the memory device 150. For example, after performing error correction decoding on the data read from the memory device 150, the error correction circuitry 138 determines whether the error correction decoding has succeeded or not, and outputs an instruction signal, e.g., a correction success signal or a correction fail signal, based on a result of the error correction decoding. The error correction circuitry 138 may use a parity bit, which has been generated during the ECC encoding process for the data stored in the memory device 150, in order to correct the error bits of the read data entries. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like.

An operation performed by the ECC decoder, that is, an operation of detecting and correcting errors included in read data, may be an operation distinct from the above-described read retry operation. According to an embodiment, the memory controller 130 may perform an error correction decoding operation through the ECC decoder when errors equal to or greater than a reference value occur even though the read retry operation, which is a repeated read operation, has been performed using the plurality of read retry levels.

The power management unit (PMU) 140 may control electrical power provided to the memory controller 130. The PMU 140 may monitor the electrical power supplied to the memory system 110, e.g., a voltage supplied to the memory controller 130, and provide the electrical power to components included in the memory controller 130. The PMU 140 may not only detect power-on or power-off, but also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the memory controller 130 and the memory device 150, in order to allow the memory controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory.

For example, when the memory device 150 includes a NAND flash memory, the memory interface 142 includes a NAND flash controller (NFC). The memory interface 142 can provide an interface for handling commands and data between the memory controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the memory controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the memory controller 130, while temporarily storing transactional data for operations performed in the memory system 110 and the memory controller 130. For example, the memory 144 may temporarily store read data entries output from the memory device 150 in response to a read request from the host 102 before the read data entries are output to the host 102. In addition, the memory controller 130 may temporarily store write data entries input from the host 102 in the memory 144 before programming the write data entries in the memory device 150. When the memory controller 130 controls operations, such as a data read operation, a data write or program operation, a data erase operation, etc., of the memory device 150, data transmitted between the memory controller 130 and the memory device 150 of the memory system 110 may be temporarily stored in the memory 144.

In addition to the read data entries or write data entries, the memory 144 may store information, e.g., map data, read requests, program requests, etc. used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The memory controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 1 illustrates, for example, the memory 144 disposed within the memory controller 130, embodiments are not limited thereto. The memory 144 may be located within or external to the memory controller 130. For instance, the memory 144 may be embodied by an external volatile memory having a memory interface transferring data and/or signals between the memory 144 and the memory controller 130. According to an embodiment, the above-described information storage region 161 and retry storage region 162 may be included in the memory 144.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). An example of the FTL will be described in detail, referring to FIGS. 3 and 4. According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor. According to an embodiment, the above-described read operation unit 171, program operation unit 172 and level reset unit 173 may be included in the processor 134.

FIG. 2 is a block diagram illustrating an example of a memory device in accordance with an embodiment of the present disclosure.

Referring to FIG. 2, the memory device 150 may include a memory cell array 201, a control operation circuit 202, and a control logic 203. The control operation circuit 202 may include an address decoder 205, the voltage supply circuit 170, a page buffer group 206, a data input/output circuit 207, and a sensing circuit 208. The control logic 203 may include an information storage region 163, a retry storage region 164, a read operation unit 165, a program operation unit 166, and a level reset unit 167.

The memory cell array 201 may include the plurality of memory blocks MEMORY BLOCK<1:6>. The plurality of memory blocks MEMORY BLOCK<1:6> may be connected to an address decoder 205 through a row line RL. The plurality of memory blocks MEMORY BLOCK<1:6> may be connected to a page buffer group 206 through bit lines BL1 to BLm. Each of the memory blocks MEMORY BLOCK<1:6> may include a plurality of memory cells. In an embodiment, the plurality of memory cells may be nonvolatile memory cells. Memory cells connected to the same word line may be defined as one page. Accordingly, one memory block may include a plurality of pages.

The row line RL may include at least one source selection line, a plurality of word lines and at least one drain selection line.

The control operation circuit 202 may perform a program, read or erase operation on a selected region of the memory cell array 201. The control operation circuit 202 may drive the memory cell array 201. For example, the control operation circuit 202 may apply various operating voltages to the row line RL and the bit lines BL1 to BLm, or discharge the applied voltages.

The control operation circuit 202 may drive the memory cell array 201. For example, the control operation circuit 202 may drive the memory cell array 201 to perform the program, read and erase operations.

The address decoder 205 may be connected to the memory cell array 201 through the row line RL. The row line RL may include the drain selection line, the word lines, the source selection line and a common source line.

The address decoder 205 may operate in response to the control of the control logic 203. The address decoder 205 may receive an address RADD from the control logic 203.

The address decoder 205 may decode a block address of the received address RADD. The address decoder 205 may select at least one memory block among the memory blocks MEMORY BLOCK<1:6> according to the decoded block address. The address decoder 205 may decode a row address of the received address RADD. The address decoder 205 may select at least one word line among word lines of the selected memory block according to the decoded row address. The address decoder 205 may apply operating voltages Vrd/Vprog/Vpass/Vers, which are supplied from the voltage supply circuit 170, to the selected word line.

During the program operation, the address decoder 205 may apply a program voltage Vprog to the selected word line, and apply a pass voltage Vpass having a lower level than the program voltage to an unselected word line. During a program verification operation, the address decoder 205 may apply a verification voltage Vrd to the selected word line, and apply a verification pass voltage Vpass having a higher level than the verification voltage to the unselected word line.

During the read operation, the address decoder 205 may apply a read voltage Vrd to the selected word line, and apply a read pass voltage Vpass having a higher level than the read voltage Vrd to the unselected word line.

The erase operation of the memory device 150 may be performed in units of memory blocks. An address ADDR inputted to the memory device 150 during the erase operation may include a block address. The address decoder 205 may decode the block address, and select at least one memory block according to the decoded block address. During the erase operation, the address decoder 205 may apply an erase voltage Vers to a word line of the selected memory block.

The voltage supply circuit 170 may generate a plurality of operating voltages Vrd/Vprog/Vpass/Vers by using an external power supply voltage supplied to the memory device 150. The voltage supply circuit 170 may operate in response to the control of the control logic 203.

In an embodiment, the voltage supply circuit 170 may regulate the external power supply voltage, and generate an internal power supply voltage. The internal power supply voltage generated by the voltage supply circuit 170 may be used as an operating voltage of the memory device 150.

In an embodiment, the voltage supply circuit 170 may generate the plurality of operating voltages Vrd/Vprog/Vpass/Vers by using the external power supply voltage or the internal power supply voltage. The voltage supply circuit 170 may generate various voltages required by the memory device 150. For example, the voltage supply circuit 170 may generate a plurality of erase voltages, a plurality of program voltages, a plurality of pass voltages, a plurality of selective read voltages and a plurality of unselective read voltages.

The voltage supply circuit 170 may include a plurality of pumping capacitors, which receive the internal power supply voltage, to generate the plurality of operating voltages Vrd/Vprog/Vpass/Vers having various voltage levels, and generate the plurality of operating voltages Vrd/Vprog/Vpass/Vers by selectively activating the plurality of pumping capacitors in response to the control of the control logic 203.

The generated operating voltages Vrd/Vprog/Vpass/Vers may be supplied to the memory cell array 201 by the address decoder 205.

The page buffer group 206 may include a plurality of page buffers PB1 to PBm. The plurality of page buffers PB1 to PBm may be connected to the memory cell array 201 through the plurality of bit lines BL1 to BLm, respectively. The plurality of page buffers PB1 to PBm may operate in response to the control of the control logic 203.

The plurality of page buffers PB1 to PBm may communicate data DATA with the data input/output circuit 207. During the program operation, the plurality of page buffers PB1 to PBm may receive the data DATA to be stored, through the data input/output circuit 207 and a data line DL.

During the program operation, the plurality of page buffers PB1 to PBm may transmit the data DATA, which is received through the data input/output circuit 207, to the selected memory cell through the bit lines BL1 to BLm when the program voltage Vprog is applied to the selected word line. Memory cells of a selected page may be programmed according to the transmitted data DATA. A memory cell connected to a bit line to which a program allowable voltage, for example, a ground voltage, is applied may have a raised threshold voltage. A threshold voltage of a memory cell connected to a bit line to which a program inhibited voltage, for example, a power supply voltage, is applied may be maintained. During the program verification operation, the plurality of page buffers PB1 to PBm may read the data DATA, which is stored in the memory cell, from the selected memory cell through the bit lines BL1 to BLm.

During the read operation, the page buffer group 206 may read the data DATA from the memory cell of the selected page through the bit lines BLs, and store the read data DATA in the plurality of page buffers PB1 to PBm.

During the erase operation, the page buffer group 206 may float the bit lines BLs. In an embodiment, the page buffer group 206 may include a column selection circuit.

The data input/output circuit 207 may be connected to the plurality of page buffers PB1 to PBm through the data line DL. The data input/output circuit 207 may operate in response to the control of the control logic 203.

The data input/output circuit 207 may include a plurality of input/output buffers (not illustrated) that receive the data DATA inputted thereto. During the program operation, the data input/output circuit 207 may receive the data DATA to be stored from an external. The data input/output circuit 207 may output the data DATA, which is transmitted from the plurality of page buffers PB1 to PBm included in the page buffer group 206, to the external during the read operation.

During the read operation or the verification operation, the sensing circuit 208 may generate a reference current in response to an allowable bit VRYBIT generated by the control logic 203, and output a pass signal PASS or a fail signal FAIL to the control logic 203 by comparing a sensing voltage VPB received from the page buffer group 206 with a reference voltage attributable to the reference current.

The control logic 203 may be connected to the address decoder 205, the voltage supply circuit 170, the page buffer group 206, the data input/output circuit 207 and the sensing circuit 208. The control logic 203 may control overall operations of the memory device 150. The control logic 203 may operate in response to a command CMD transmitted from an external device.

The control logic 203 may generate various signals in response to the command CMD and the address ADDR, and control the other components 154 to 158 included in the control operation circuit 202. For example, the control logic 203 may generate an operation signal OPSIG, the address RADD, read and write circuit control signals PBSIGNALS and the allowable bit VRYBIT in response to the command CMD and the address ADDR. The control logic 203 may output the operation signal OPSIG to the voltage supply circuit 170, output the address RADD to the address decoder 205, output the read and write control signals PBSIGNALS to the page buffer group 206, and output the allowable bit VRYBIT to the sensing circuit 208. In addition, the control logic 203 may determine whether the verification operation has passed or failed, in response to the pass or fail signal PASS or FAIL outputted by the sensing circuit 208.

More specifically, the control logic 203 may store the plurality of default levels, which respectively correspond to the plurality of memory blocks MEMORY BLOCK<1:6> included in the memory device, in the information storage region 163 therein. In this case, the plurality of default levels may refer to read levels used as defaults when the read operation is performed on the selected word line of the selected block corresponding to the predetermined condition among the plurality of memory blocks MEMORY BLOCK<1:6> included in the memory device. In addition, the control logic 203 may determine the plurality of default levels according to various parameters such as a physical location of each of the plurality of memory blocks MEMORY BLOCK<1:6> or a program/erase cycle.

In addition, the control logic 203 may control the control operation circuit 202 to perform the read operation on the selected word line in response to the read request for the selected word line of the selected block corresponding to the predetermined condition. The control logic 203 may control the control operation circuit 202 to perform one of a first read operation using a selected default level corresponding to the selected block among the plurality of default levels stored in the information storage region 163 and a second read operation using an adjusted level smaller than the selected default level by a predetermined level on the selected word line. The control operation circuit 202 may perform the first read operation, and then output, to the control logic 203, whether the first read operation is passed or failed. The control operation circuit 202 may perform the second read operation, and output, to the control logic 203, whether the second read operation is passed or failed. The control logic 203 may reset the adjusted level to the selected default level and store the reset level in the information storage region 163 when the number of times that the second read operation is passed is greater than the number of times that the first read operation is passed by a reference number of times or more.

More specifically, when the control logic 203 controls the control operation circuit 202 to perform the first read operation first, and then receives a response from the control operation circuit 202 that the first read operation has failed, the control logic 203 may control the control operation circuit 202 to perform the second read operation. In addition, the control logic 203 may count the number of times the first read operation is passed as a first pass value. Moreover, the control logic 203 may count the number of times the second read operation is passed as a second pass value. That is, the control logic 203 may up-count the first pass value when the passed read operation is the first read operation, and up-count the second pass value when the passed read operation is the second read operation when the response that the read operation performed on the selected word line has been passed is transmitted from the control operation circuit 202. In this case, the control logic 203 may store the first and second pass values in a form corresponding to the selected default level in the information storage region 163.

The control logic 203 may reset the adjusted level to the selected default level and store the reset level in the information storage region 163 when the second pass value is greater than the first pass value by a reference number of times or more while the read operation is performed on the selected word line of the selected block corresponding to the predetermined condition. When resetting the adjusted level to the selected default level, the control logic 203 may initialize the first and second pass values corresponding to the selected default level.

The control logic 203 may control the control operation circuit 202 to set a boundary word line, which corresponds to a word line programmed last in an open block among the plurality of memory blocks MEMORY BLOCK<1:6> included in the memory device, to the selected word line of the selected block and perform the read operation on the boundary word line. That is, the selected word line of the selected block corresponding to the predetermined condition may be the boundary word line corresponding to the word line programmed last in the open block among the plurality of memory blocks MEMORY BLOCK<1:6>.

The control logic 203 may control the control operation circuit 202 to perform the program operation on the selected block, which is the open block. When the boundary word line of the selected block is changed according to the program operation on the selected block, the control logic 203 may reset the changed boundary word line to the selected word line. The control logic 203 may initialize the first and second pass values corresponding to the selected default level when the selected word line of the selected block is reset according to the program operation on the selected block.

For reference, the plurality of memory blocks MEMORY BLOCK<1:6> may be divided into open blocks, closed blocks and free blocks. In this case, the open blocks may be blocks in which data can be stored. The closed blocks may be blocks to which data have been written or data can no longer be written. The free blocks may be blocks to which data have not yet been written. Accordingly, a word line in which data have been already programmed and a word line in which data have not yet been programmed may be included together in the plurality of word lines included in the open blocks. The boundary word line may refer to a last programmed word line, and be in a state of being physically adjacent to the word line in which data have not yet been programmed. In this case, the state in which two word lines are physically adjacent to each other may refer to a state in which no physical word line is present between the two word lines.

The control logic 203 may store a plurality of read retry levels in the retry storage region 164 therein. In this case, each of the plurality of read retry levels may refer to a level of a read voltage that the control logic 203 uses when performing a read retry operation of retrying the read operation after the read operation on the memory blocks MEMORY BLOCK<1:6> fails.

The control logic 203 may control the control operation circuit 202 to perform the read operation using the plurality of read retry levels when receiving the response that the second read operation subsequent to the first read operation has failed from the control operation circuit 202.

The control logic 203 may control the control operation circuit 202 to perform the read operation using the plurality of read retry levels without using the selected default level or the adjusted level when performing the read operation on the other word lines except for the boundary word line among the plurality of word lines included in the open block among the plurality of memory blocks MEMORY BLOCK<1:6>.

When performing the read operation on the plurality of word lines included in the closed block among the plurality of memory blocks MEMORY BLOCK<1:6> included in the memory device, the control logic 203 may control the control operation circuit 202 to perform the read operation using the plurality of read retry levels without using the selected default level or the adjusted level.

The above-described operation of the control logic 203 may be implemented through the operations of the read operation unit 165, the program operation unit 166 and the level reset unit 167 included in the control logic 203. In this case, the read operation unit 165, the program operation unit 166 and the level reset unit 167 may be implemented as software or hardware.

Specifically, in response to a read request for the selected word line of the selected block corresponding to the predetermined condition, the read operation unit 165 may control the control operation circuit 202 to perform the first read operation using the selected default level corresponding to the selected block among the plurality of default levels stored in the information storage region 163, and control the control operation circuit 202 to perform the second read operation using the adjusted level smaller than the selected default level by a predetermined level when the first read operation fails.

The read operation unit 165 may control the control operation circuit 202 to perform the read operation, using the plurality of read retry levels stored in the retry storage region 164, on the selected word line when the second read operation also fails after the first read operation fails.

The read operation unit 165 may control the control operation circuit 202 to perform the read operation using the plurality of read retry levels stored in the retry storage region 164 without performing the first and second read operations in response to the read request for the other word lines except for the boundary word line among the plurality of word lines included in the closed block or the plurality of word lines included in the open block among the plurality of memory blocks MEMORY BLOCK<1:6>.

The level reset unit 167 may generate the first pass value obtained by counting a pass number of times through the first read operation and the second pass value obtained by counting a pass number of times through the second read operation, whenever the read operation performed by the read operation unit 165 on the selected word line is passed, and when the second pass value is greater than the first pass value by a reference value or more, the level reset unit 167 may reset the adjusted level to the selected default level, and store the reset level in the information storage region 163.

The level reset unit 167 may store the first and second pass values in a form corresponding to the selected default level in the information storage region 163.

When resetting the adjusted level to the selected default level, the level reset unit 167 may initialize the first and second pass values corresponding to the selected default level stored in the information storage region 163.

The program operation unit 166 may control the control operation circuit 202 to perform the program operation on at least one of the plurality of memory blocks MEMORY BLOCK<1:6> according to a program request. That is, the program operation unit 166 may control the control operation circuit 202 to perform the program operation on the selected block corresponding to the predetermined condition.

When the boundary word line of the selected block is changed according to the program operation performed on the selected block through the control operation circuit 202 under the control of the program operation unit 166, the changed boundary word line may be reset to the selected word line. In this way, when the boundary word line is changed according to the program operation performed on the selected block and the selected word line of the selected block is reset, the level reset unit 167 may initialize the first and second pass values corresponding to the selected default level stored in the information storage region 163.

FIGS. 3A to 3D are diagrams illustrating an example of a read compensation scheme in accordance with an embodiment of the present disclosure.

Referring to FIGS. 3A to 3D, it may be seen how the read compensation scheme according to the present embodiment is implemented through a form in which a plurality of default levels DFV<1:6>, a first pass value PASS VALUE<1> and a second pass value PASS VALUE<2> stored in the information storage region 161 or 163 are changed according to operation steps in the sequence of time.

Referring to FIG. 3A, the plurality of default levels DFV<1:6> stored in the information storage region 161 or 163 may correspond to a plurality of memory blocks MEMORY BLOCK<1:6>, respectively. According to an embodiment, the first to sixth default levels DFV<1:6> respectively corresponding to the first to sixth memory blocks MEMORY BLOCK<1:6> may be in a state of being stored in the information storage region 161 or 163. According to an embodiment, all of the first to sixth default levels DFV<1:6> may have different values. According to another embodiment, at least some of the first to sixth default levels DFV<1:6> may have the same value.

Among the plurality of memory blocks MEMORY BLOCK<1:6>, the first memory block MEMORY BLOCK<1> may be in a closed state CLOSE, the sixth memory block MEMORY BLOCK<6> may be in an erased state ERASE, and the second to fifth memory blocks MEMORY BLOCK<2:5> may be in an open state. In this case, since the plurality of default levels DFV<1:6> are values determined according to various parameters such as a physical location of each of the plurality of memory blocks MEMORY BLOCK<1:6> or a program/erase cycle, the plurality of default levels DFV<1:6> may be determined as specific values regardless of the states of the memory blocks, that is, the open state OPEN, the closed state CLOSE and the erased state ERASE, and be stored in the information storage region 161 or 163.

In the case of the first memory block MEMORY BLOCK<1> in the closed state CLOSE, since all word lines included therein may be in a program state, a boundary word line may not be present. Accordingly, the read operation using the plurality of read retry levels may be performed on the first memory block MEMORY BLOCK<1> without performance of the first read operation using the first default level DFV1 and the second read operation using a first adjusted level DFV1-A lower than the first default level DFV1 by a predetermined level A. The first pass value PASS VALUE<1> and the second pass value PASS VALUE<2> corresponding to the first memory block MEMORY BLOCK<1> may not be present or may be in a state of having no meaning values N/A (not available) even though the first pass value PASS VALUE<1> and the second pass value PASS VALUE<2> are present.

Similarly, in the case of the sixth memory block MEMORY BLOCK<6> in the erased state ERASE, since all word lines included therein may be in the erased state, a boundary word line may not be present. Accordingly, no read operation may be performed on the sixth memory block MEMORY BLOCK<6>. In addition, the first pass value PASS VALUE<1> and the second pass value PASS VALUE<2> corresponding to the sixth memory block MEMORY BLOCK<6> may not be present or be in a state of having no meaning values N/A even though the first pass value PASS VALUE<1> and the second pass value PASS VALUE<2> are present.

In the case of the second memory block MEMORY BLOCK<2> in the open state OPEN, both of the first pass value PASS VALUE<1> and the second pass value PASS VALUE<2> corresponding to the second memory block MEMORY BLOCK<2> may be 0. That is, the first read operation using the second default level DFV2 and the second read operation using a second adjusted level DFV2-A lower than the second default level DFV2 by the predetermined level A may have been never once performed on a boundary word line included in the second memory block MEMORY BLOCK<2>, the first and second read operations on the boundary word line may have failed, or the boundary word line may have been changed according to the program operation on the second memory block MEMORY BLOCK<2> and both of the first pass value PASS VALUE<1> and the second pass value PASS VALUE<2> may have been initialized.

In the case of the third memory block MEMORY BLOCK<3> in the open state OPEN, the first pass value PASS VALUE<1> corresponding to the third memory block MEMORY BLOCK<3> may be 2, and the second pass value PASS VALUE<2> corresponding to the third memory block MEMORY BLOCK<3> may be 2. That is, the first read operation using the third default level DFV3 may have been performed at least three times on a boundary word line included in the third memory block MEMORY BLOCK<3>, and may have been passed two times of the three times. In addition, the first read operation using the third default level DFV3 performed on the boundary word line included in the third memory block MEMORY BLOCK<3> may have failed at least two times, and then the second read operation using a third adjusted level DFV3-A lower than the third default level DFV3 by the predetermined level A is passed two times.

In the case of the fourth memory block MEMORY BLOCK<4> in the open state OPEN, the first pass value PASS VALUE<1> corresponding to the fourth memory block MEMORY BLOCK<4> may be 8, and the second pass value PASS VALUE<2> corresponding to the fourth memory block MEMORY BLOCK<4> may be 3. That is, the first read operation using the fourth default level DFV4 may have been performed at least 11 times on a boundary word line included in the fourth memory block MEMORY BLOCK<4>, and may be passed eight times of the 11 times. In addition, the first read operation using the fourth default level DFV4 may have failed at least three times on the boundary word line included in the fourth memory block MEMORY BLOCK<4>, and then the second read operation using a fourth adjusted level DFV4-A lower than the fourth default level DFV4 by the predetermined level A is passed three times.

In the case of the fifth memory block MEMORY BLOCK<5> in the open state OPEN, the first pass value PASS VALUE<1> corresponding to the fifth memory block MEMORY BLOCK<5> may be 1, and the second pass value PASS VALUE<2> corresponding to the fifth memory block MEMORY BLOCK<5> may be 2. That is, the first read operation using the fifth default level DFV5 may be performed at least three times on a boundary word line included in the fifth memory block MEMORY BLOCK<5>, and may be passed one time of the three times. In addition, the first read operation using the fifth default level DFV5 may have failed at least two times on the boundary word line included in the fifth memory block MEMORY BLOCK<5>, and then the second read operation using a fifth adjusted level DFV5-A lower than the fifth default level DFV5 by the predetermined level A is passed two times.

Referring to FIG. 3B, after a state illustrated in FIG. 3A, a case in which the read operation is performed on the boundary word line of the third memory block MEMORY BLOCK<3> and the read operation is performed the fifth memory block MEMORY BLOCK<5> is described.

After the state illustrated in FIG. 3A, for the boundary word line of the third memory block MEMORY BLOCK<3>, the first read operation using the third default level DFV3 may fail, and then the second read operation using the third adjusted level DFV3-A lower than the third default level DFV3 by the predetermined level A may be passed. Accordingly, the first pass value PASS VALUE<1> corresponding to the third memory block MEMORY BLOCK<3> may continuously maintain 2, and the second pass value PASS VALUE<2> corresponding to the third memory block MEMORY BLOCK<3> may change from 2 to 3 (2→3).

In addition, after the state illustrated in FIG. 3A, for the boundary word line included in the fifth memory block MEMORY BLOCK<5>, the first read operation using the fifth default level DFV5 may fail, and then the second read operation using the fifth adjusted level DFV5-A lower than the fifth default level DFV5 by the predetermined level A may be passed. Accordingly, the first pass value PASS VALUE<1> corresponding to the fifth memory block MEMORY BLOCK<5> may continuously maintain 1, and the second pass value PASS VALUE<2> corresponding to the fifth memory block MEMORY BLOCK<5> may change from 2 to 3 (2→3).

Referring to FIG. 3C, when the reference value is 2 in a state illustrated in FIG. 3B in which the second pass value PASS VALUE<2> corresponding to each of the third memory block MEMORY BLOCK<3> and the fifth memory block MEMORY BLOCK<5> increases, an operation of selecting whether to change the default levels DFV<3, 5> corresponding to the third memory block MEMORY BLOCK<3> and the fifth memory block MEMORY BLOCK<5> is described.

In the case of the third memory block MEMORY BLOCK<3>, it may be seen that the second pass value PASS VALUE<2> corresponding to the state illustrated in FIG. 3B increases, but the difference between the first pass value PASS VALUE<1> of 2 and the second pass value PASS VALUE<2> of 3 is 1, which is smaller than the reference value of 2. Accordingly, the default level corresponding to the third memory block MEMORY BLOCK<3> may be the third default level DFV3 stored in the information storage region 161 or 163 without being reset.

In the case of the fifth memory block MEMORY BLOCK<5>, it may be seen that the second pass value PASS VALUE<2> corresponding to the state illustrated in FIG. 3B increases, and the difference between the first pass value PASS VALUE<1> of 1 and the second pass value PASS VALUE<2> of 3 is 2, which is equal to the reference value of 2. Accordingly, the default level corresponding to the fifth memory block MEMORY BLOCK<5> may be reset from the fifth default level DFV5 to the fifth adjusted level DFV5-A. That is, the fifth default level DFV5 stored in the information storage region 161 or 163 in the form corresponding to the fifth memory block MEMORY BLOCK<5> may be updated to the fifth adjusted level DFV5-A, and the fifth adjusted level DFV5-A may be stored. After the operation illustrated in FIG. 3C, the default level corresponding to the fifth memory block MEMORY BLOCK<5> may be the fifth adjusted level DFV5-A.

When the default level corresponding to the fifth memory block MEMORY BLOCK<5> is reset from the fifth default level DFV5 to the fifth adjusted level DFV5-A, both of the first pass value PASS VALUE<1> and the second pass value PASS VALUE<2> corresponding to the fifth memory block MEMORY BLOCK<5> may be initialized to 0 (1→0, 3→0).

Referring to FIG. 3D, after a state illustrated in FIG. 3C, a case in which the program operation is performed on the third memory block MEMORY BLOCK<3> and the read operation is performed on the fourth memory block MEMORY BLOCK<4> is described.

After the state illustrated in FIG. 3C, the program operation may be performed on the third memory block MEMORY BLOCK<3>. The boundary word line may be changed according to the program operation performed on the third memory block MEMORY BLOCK<3>. Accordingly, both of the first pass value PASS VALUE<1> and the second pass value PASS VALUE<2> corresponding to the third memory block MEMORY BLOCK<3> may be initialized to 0 (2→0, 3→0).

After the state illustrated in FIG. 3C, for the boundary word line included in the fourth memory block MEMORY BLOCK<4>, the first read operation using the fourth default level DFV4 may fail, and then the second read operation using the fourth adjusted level DFV4-A lower than the fourth default level DFV4 by the predetermined level A may also fail. Accordingly, the first pass value PASS VALUE<1> corresponding to the fourth memory block MEMORY BLOCK<4> may continuously maintain 8, and the second pass value PASS VALUE<2> may also continuously maintain 3. In this case, for the fourth memory block MEMORY BLOCK<4>, the second read operation using the fourth adjusted level DFV4-A may fail, and then the read operation using the plurality of read retry levels may be performed.

FIG. 4 is a flowchart for describing an operation sequence of the read compensation scheme in accordance with an embodiment of the present disclosure.

Referring to FIG. 4, an operation may start according to a read request in operation S10.

It may be checked whether the read request of operation S10 corresponds to an open block, in operation S20.

When the read request of operation S10 does not correspond to the open block (that is, "NO" in operation S20), a read operation may be performed using a default read defense algorithm defined in advance, in operation S50. In this case, the default read defense algorithm may include a read operation using a plurality of read retry levels. In addition, the default read defense algorithm may include an operation performed by the ECC decoder of the error correction unit 138, the operation being described with reference to FIG. 1, that is, an operation of detecting and correcting errors included in data which is read. Moreover, the default read defense algorithm may include a read operation of determining, by the control logic 203, whether the read operation is passed or failed in response to a pass or fail signal outputted by the sensing circuit 208 and using a plurality of read retry levels according to the determination result, the read operation being described with reference to FIG. 2.

When the read request of operation S10 corresponds to the open block (that is, "YES" in operation S20), it may be checked whether the read request of operation S10 corresponds to a boundary word line, in operation S30.

When the read request of operation S10 corresponds to the other word lines except for the boundary word line among a plurality of word lines included in the open block (that is, "NO" in operation S30), the read operation may be performed using the default read defense algorithm defined in advance, in operation S50.

When the read request of operation S10 corresponds to the boundary word line of the open block (that is, "YES" in operation S30), the read compensation scheme corresponding to a distinguishing operation of the present disclosure may be used in operation S40. The read compensation scheme of operation S40 corresponding to the distinguishing operation of the present disclosure may include the following operations.

First, a first read operation may be performed using a default level corresponding to the read-requested open block, in operation S41.

It may be checked whether the first read operation of operation S41 is passed, in operation S42.

When the first read operation is passed in operation S42 (that is, "YES" in operation S42), a first pass value PASS VALUE<1> may be up-counted in operation S43.

When the first read operation fails in operation S42 (that is, "NO" in operation S42), a second read operation may be performed using an adjusted level lower than the default level corresponding to the read-requested open block by a predetermined level, in operation S44.

It may be checked whether the second read operation of operation S44 is passed, in operation S45.

When the second read operation fails in operation S45 (that is, "NO" in operation S45), the read compensation scheme of operation S40 corresponding to the distinguishing operation of the present disclosure may be terminated, and then the read operation may be performed using the default read defense algorithm defined in advance, in operation S50.

When the second read operation is passed in operation 45 (that is, "YES" in operation S45), a second pass value PASS VALUE<2> may be up-counted in operation S46.

It may be checked whether a value obtained by subtracting the first pass value PASS VALUE<1> from the second pass value PASS VALUE<2> that is up-counted in operation S46 is equal to or greater than a reference value, in operation S47.

When the value obtained by subtracting the first pass value PASS VALUE<1> from the second pass value PASS VALUE<2> that is up-counted in operation S46 is equal to or greater than the reference value (that is, "YES" in operation S47), the adjusted level used during the second read operation may be reset to a new default level in operation S48. That is, when the first read operation is performed according to a new read request after operation S48, the default level that is reset in operation S48 may be used.

When the value obtained by subtracting the first pass value PASS VALUE<1> from the second pass value PASS VALUE<2> that is up-counted in operation S46 is smaller than the reference value (that is, "NO" in operation S47), the default level used during the first read operation may be maintained without being changed, in operation S49.

In accordance with embodiments of the present disclosure, it is possible to count the number of times of passes of a read level used for a read compensation scheme for a boundary word line programmed last in a memory block, and to dynamically change the read level according to the counting result.

Accordingly, an inevitable increase in read latency due to the read compensation scheme may be minimized, and reliability of a read operation may increase.

While the present disclosure has been illustrated and described with respect to specific embodiments and drawings, the disclosed embodiments are not intended to be restrictive. Further, it is noted that the present disclosure may be achieved in various ways through substitution, change, and modification, as those skilled in the art will recognize in light of the present disclosure, without departing from the spirit and/or scope of the present disclosure and the following claims. Furthermore, the embodiments may be combined to form additional embodiments.

What is claimed is:

1. A memory system comprising:
   a memory device including a plurality of memory blocks each including a plurality of word lines; and
   a controller configured to:
   store a plurality of default levels, which respectively correspond to the plurality of memory blocks, in an information storage region therein, and
   perform a read operation on a selected word line of a selected block among the plurality of memory blocks,
   wherein the read operation is performed by:
   performing a read operation using a selected default level of the plurality of default levels, the selected default level corresponding to the selected block, and
   performing, when the read operation using the selected default level fails, a read operation using an adjusted level smaller than the selected default level by a predetermined level, and
   wherein the controller is further configured to:
   reset the adjusted level to the selected default level when a number of times that the read operation using the adjusted level is passed is greater than a number of times that the read operation using the selected default level is passed by a reference number of times or more, and
   store the reset level in the information storage region.

2. The memory system of claim 1, wherein:
   the selected word line is a boundary word line, which corresponds to a word line programmed last among the word lines of the selected block, and
   the selected block is an open block.

3. The memory system of claim 2, wherein the controller is further configured to:
   generate, whenever any of the first and second read operations is passed, a first pass value representing the number of times that the read operation using the selected default level is passed and a second pass value representing the number of times that the read operation using the adjusted level is passed, and
   store the first and second pass values in the information storage region.

4. The memory system of claim 3, wherein the controller is further configured to initialize the first and second pass values in response to the resetting.

5. The memory system of claim 4, wherein the controller is further configured to:
perform a program operation on the selected block, and
initialize the first and second pass values when the selected word line changes because of the performing of the program operation.

6. The memory system of claim 2, wherein the controller is further configured to:
store a plurality of read retry levels in a retry storage region therein, and
perform, when the read operation using the adjusted level fails, a read operation on the selected word line using the plurality of read retry levels.

7. The memory system of claim 6, wherein the controller is further configured to perform a read operation on remaining word lines other than the selected word line within the selected block using the plurality of read retry levels.

8. A memory device comprising:
a plurality of memory blocks each including a plurality of word lines;
a control operation circuit configured to perform a read operation on each of the plurality of word lines and output whether the read operation performed is passed or failed; and
a control logic configured to:
store a plurality of default levels, which respectively correspond to the plurality of memory blocks, in an information storage region therein,
control the control operation circuit to perform one of a first read operation using a selected default level corresponding to a selected block among the plurality of default levels and a second read operation using an adjusted level smaller than the selected default level by a predetermined level,
reset the adjusted level to the selected default level when a number of times that the second read operation is passed is greater than a number of times that the first read operation is passed, by a reference number of times or more, and
store the reset level in the information storage region.

9. The memory device of claim 8, wherein the control logic includes:
a read operation unit configured to control the control operation circuit to perform the first read operation and control the control operation circuit to perform the second read operation when the first read operation has failed; and
a level reset unit configured to:
generate, whenever any of the first and second read operations is passed, a first pass value representing the number of times that the first read operation is passed and a second pass value representing the number of times that the second read operation is passed,
reset the adjusted level to the selected default level when the second pass value is greater than the first pass value by the reference value or more, and
store the reset level in the information storage region.

10. The memory device of claim 9, wherein:
the selected word line is a boundary word line corresponding to a word line programmed last among the word lines of the selected block, and
the selected block is an open block.

11. The memory device of claim 10, wherein the level reset unit is further configured to store the first and second pass values to correspond to the selected default level in the information storage region.

12. The memory device of claim 11, wherein the level reset unit is further initialize the first and second pass values in response to the resetting.

13. The memory device of claim 12, wherein:
the control operation circuit is further configured to perform a program operation on each of the plurality of word lines, and output whether the program operation performed is passed or failed,
the control logic further includes a program operation unit configured to control the control operation circuit to perform the program operation on the selected block according to a program request for the selected block, and
the level reset unit is further configured to initialize the first and second pass values when the boundary word line changes according to the program operation performed on the selected block.

14. The memory device of claim 10, wherein:
the control logic further includes a retry storage region for storing a plurality of read retry levels, and
the read operation unit is further configured to control the control operation circuit to perform, when the second read operation fails, a read operation on the selected word line using the plurality of read retry levels.

15. The memory device of claim 14, wherein the read operation unit is further configured to control the control operation circuit to perform a read operation on remaining word lines other than the selected word line within the selected block using the plurality of read retry levels.

16. An operating method of a memory device, the operating method comprising:
setting a boundary word line corresponding to a word line programmed last in an open block among a plurality of memory blocks to a selected word line and performing a read operation on the selected word line;
performing a first read operation on the selected word line using a selected default level of a plurality of default levels;
performing, when the first read operation fails, a second read operation on the selected word line using an adjusted level smaller than the selected default level by a predetermined level;
counting, as a first pass value, a number of times that the first read operation is passed and counting, as a second pass value, a number of times that the second read operation is passed; and
resetting the adjusted level to the selected default level when the second pass value is greater than the first pass value by a reference value or more.

17. The operating method of claim 16, further comprising initializing the first and second pass values in response to the resetting.

18. The operating method of claim 17, further comprising:
performing a program operation on the open block; and
initializing the first and second pass values when the boundary word line is changed according to the performing of the program operation.

19. The operating method of claim 16, further comprising performing, when the second read operation fails, a read operation on the selected word line using a plurality of read retry levels.

20. The operating method of claim 19, further comprising performing a read operation on remaining word lines other than the selected word line within the open block using the plurality of read retry levels.

21. An operating method of a control unit, the operating method comprising:
- counting first and second numbers of successes of respective first and second read operations on a memory cell group, the first and second read operations being performed according to respective first and second read biases and the second read operation being performed when the first read operation fails; and
- replacing, when the second number becomes greater than the first number by a threshold, a value of the first read bias with a value of the second read bias for subsequent read operations.

* * * * *